United States Patent
Hartmann et al.

(10) Patent No.: US 8,387,636 B2
(45) Date of Patent: Mar. 5, 2013

(54) DEVICE FOR CLEANING SUBSTRATES ON A CARRIER

(75) Inventors: Christoph Hartmann, Freudenstadt (DE); Sven Worm, Schopfloch (DE)

(73) Assignee: Gebr. Schmid GmbH (DE)

( * ) Notice: Subject to any disclaimer, the term of this patent is extended or adjusted under 35 U.S.C. 154(b) by 0 days.

(21) Appl. No.: 13/356,259

(22) Filed: Jan. 23, 2012

(65) Prior Publication Data

US 2012/0132236 A1    May 31, 2012

Related U.S. Application Data

(63) Continuation of application No. PCT/EP2010/060668, filed on Jul. 22, 2010.

(30) Foreign Application Priority Data

Jul. 23, 2009   (DE) .......................... 10 2009 035 341

(51) Int. Cl.
*B08B 3/02* (2006.01)

(52) U.S. Cl. .......... 134/156; 134/43; 134/137; 134/902; 134/25.4; 134/169 R; 134/166 R; 134/167 R; 134/168 R; 134/168 C; 134/167 C; 134/171; 134/166 C; 134/25.1

(58) Field of Classification Search .................. 134/25.1, 134/43, 137, 156, 166 R–168 R, 168 C, 167 C, 134/171, 166 C, 25.4, 169 R, 902
See application file for complete search history.

(56) References Cited

U.S. PATENT DOCUMENTS

| 4,132,567 | A | * | 1/1979 | Blackwood | 134/1 |
| 4,318,749 | A | * | 3/1982 | Mayer | 134/25.4 |
| 4,693,777 | A | * | 9/1987 | Hazano et al. | 156/345.31 |
| 5,000,795 | A | * | 3/1991 | Chung et al. | 134/37 |
| 5,003,999 | A | | 4/1991 | Cardani et al. | |
| 5,143,103 | A | * | 9/1992 | Basso et al. | 134/98.1 |
| 5,782,990 | A | * | 7/1998 | Murakami et al. | 134/26 |
| 5,908,042 | A | * | 6/1999 | Fukunaga et al. | 134/25.1 |
| 5,992,431 | A | * | 11/1999 | Weber et al. | 134/135 |
| 6,161,300 | A | * | 12/2000 | Kim | 34/73 |
| 6,416,587 | B1 | * | 7/2002 | Lu et al. | 134/2 |

(Continued)

FOREIGN PATENT DOCUMENTS

| CH | 280659 A | 1/1952 |
| DE | 102005014052 A1 | 10/2005 |

(Continued)

OTHER PUBLICATIONS

International Preliminary Report on Patentability issued in connection with PCT/EP2010/060668.

(Continued)

*Primary Examiner* — Michael Barr
*Assistant Examiner* — Kevin G Lee
(74) *Attorney, Agent, or Firm* — Akerman Senterfitt

(57) ABSTRACT

An apparatus for cleaning substrates on a carrier, which has in the interior thereof a plurality of longitudinal passages, which run parallel to one another and are connected to the outside at the underside of the carrier via openings. There is provided a plurality of elongated pipes, which are arranged on a pipe holder and are connected in a fluid-conducting manner to a fluid supply. A centering template is provided, which encompasses the pipes and is displaceable in the longitudinal direction thereof between an attachment position in the end region of the pipes away from the pipe holder and a working position, which lies between the attachment position and the pipe holder. The centering template bears against the carrier, such that the pipes are then aligned exactly with the longitudinal passages.

20 Claims, 2 Drawing Sheets

U.S. PATENT DOCUMENTS

| | | | |
|---|---|---|---|
| 6,505,636 B1 * | 1/2003 | Travis | 134/179 |
| 6,558,476 B2 * | 5/2003 | Yokomizo | 134/26 |
| 6,589,359 B2 * | 7/2003 | Kamikawa et al. | 134/26 |
| 6,616,774 B2 * | 9/2003 | Sonoda et al. | 134/32 |
| 6,668,844 B2 * | 12/2003 | Lund et al. | 134/155 |
| 6,673,195 B2 * | 1/2004 | Chen et al. | 156/345.23 |
| 6,699,330 B1 * | 3/2004 | Muraoka | 134/3 |
| 8,083,865 B2 * | 12/2011 | Geppert et al. | 134/167 C |
| 8,241,432 B2 * | 8/2012 | Gibbel | 134/25.1 |
| 2004/0194814 A1 * | 10/2004 | Nishimura | 134/32 |
| 2005/0067001 A1 * | 3/2005 | Gast et al. | 134/25.1 |
| 2005/0236018 A1 * | 10/2005 | Nagami | 134/30 |
| 2006/0048801 A1 * | 3/2006 | Jacobs et al. | 134/86 |
| 2008/0295860 A1 | 12/2008 | Burger | |

FOREIGN PATENT DOCUMENTS

| | | | |
|---|---|---|---|
| DE | 102005019997 A1 | | 12/2005 |
| GB | 2318075 A | | 1/1997 |
| JP | 9019921 A | | 1/1997 |
| JP | 9207126 A | | 8/1997 |
| JP | 09207126 A | * | 8/1997 |
| WO | 2011009917 A2 | | 1/2011 |

OTHER PUBLICATIONS

Written Opinion issued in connection with PCT/EP2010/060668.

* cited by examiner

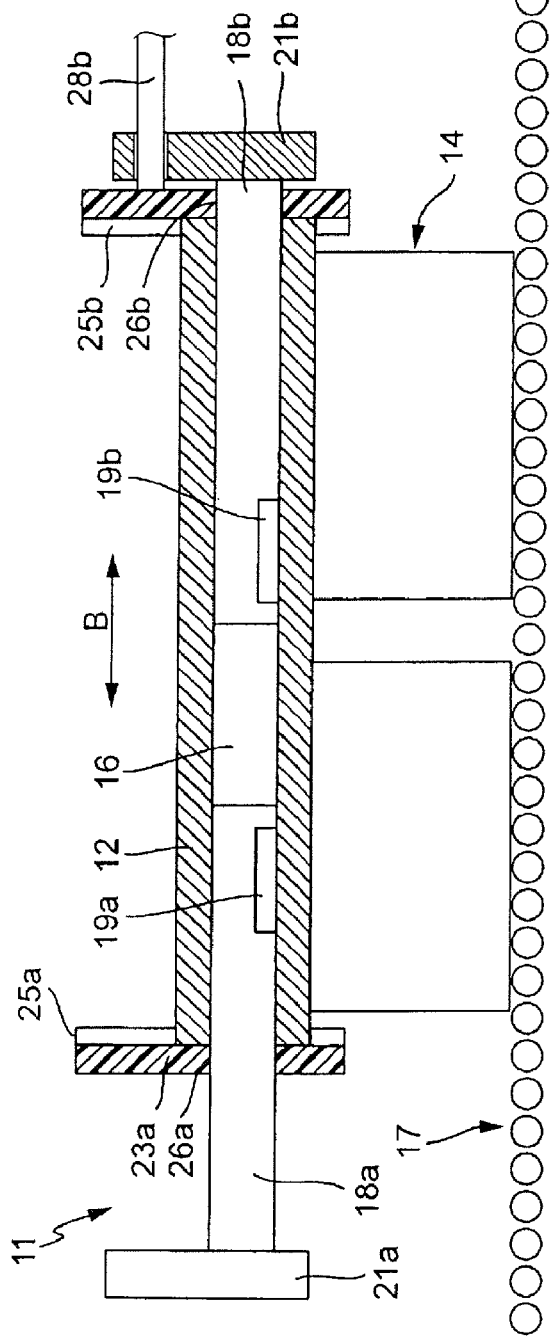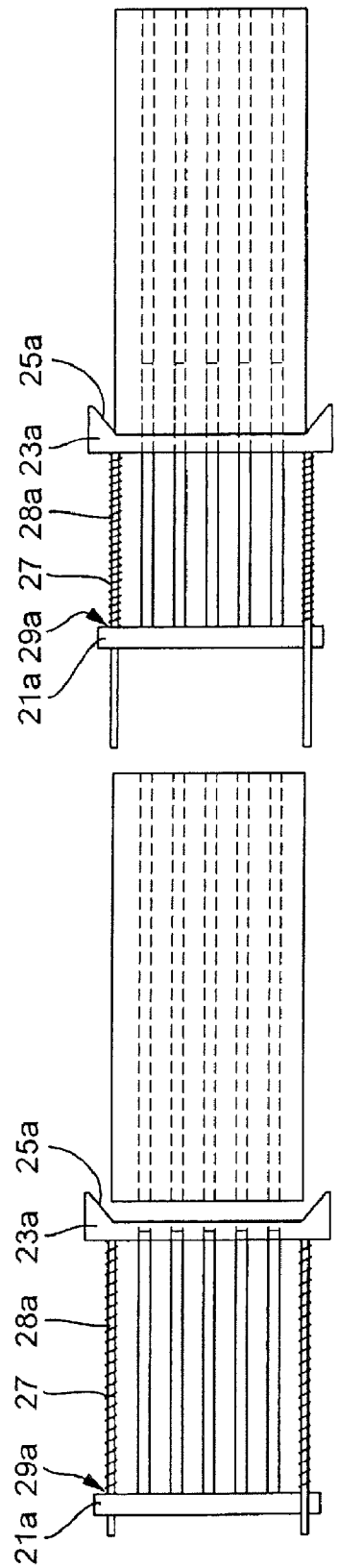

DEVICE FOR CLEANING SUBSTRATES ON A CARRIER

CROSS-REFERENCE TO RELATED APPLICATIONS

This application is a continuation of PCT Application No. PCT/EP2010/060668, filed Jul. 22, 2010, and claims priority to DE 10 2009 035 341.0 filed Jul. 23, 2009, the disclosures of which are hereby incorporated by reference in their entirety.

FIELD OF APPLICATION AND PRIOR ART

The invention relates to a device for cleaning substrates on a carrier.

Such a cleaning device having pipes for cleaning is known in principle from German Patent Application DE 10 2009 035 343 A1. Provided here is at least one elongated pipe which is inserted into a longitudinal passage in the carrier, to which the plurality of substrates are attached, and in the process introduces cleaning fluid at various locations. This cleaning fluid is to discharge between openings in the lower region of the longitudinal passages into spaces between the substrates and is to clean impurities from these spaces in the process.

OBJECT OF THE INVENTION

The object of the invention is to provide a device mentioned at the beginning with which problems of the prior art can be removed and which in particular ensures reliable and trouble-free operation.

This object is achieved by a device having the features of claim 1 or 11. Advantageous and preferred configurations of the invention are the subject matter of the further claims and are explained in more detail below. The wording of the claims is incorporated into the description by express reference.

In a first basic configuration of the invention, the device has a plurality of longitudinal pipes which run parallel to one another and which are arranged on a pipe holder and are connected in a fluid-conducting manner to a fluid supply. For example, there are four to six pipes. According to the invention, a centring template is provided here which encompasses the pipes and is movable relative to the latter in the longitudinal direction thereof. The centring template has guides for the pipes, wherein the diameter of these guides is only slightly larger than the outside diameter of the pipes, for example 2% to 10%. The centring template is movable in a relative manner between an attachment position and a working position. In the attachment position, the centring template is located in the end region of the pipes away from the pipe holder, that is to say possibly at exactly the same level as the ends of the pipes or even a short distance in front of said pipes. In any case, the pipes should be guided in the guides of the centring template. In a working position, the centring template is in turn moved away from the attachment position, to be precise in the longitudinal direction of the pipes towards the pipe holder.

This therefore means, when the device is attached to the carrier, in the course of which the carrier has to be manipulated very carefully on account of the substrates still located on it, that the centring template can be brought to the carrier in an exactly predetermined relationship. As a result, the pipes guided in the centring template are also located in an exactly predetermined relationship to the carrier or the longitudinal passages thereof. In this case, it is considerably easier to attach such a centring template to the carrier, in particular to the end face thereof with the longitudinal passages therein or the access openings thereof, than it is to attach a plurality of pipes to said carrier.

In a further configuration of the invention, the centring template can also have protruding centring projections or the like. Said centring projections can additionally serve to engage on the carrier, or on the end face pointing towards the centring template, in an exactly predetermined relationship. For this purpose, suitable apertures or the like for the centring projections can be provided in the carrier. It is important for such centring projections that they project beyond the ends of the pipes, that is to say that, at any rate, first the centring projections and if possible the entire centring template bears against the carrier or is in an exactly predetermined and matching relationship to said carrier. This is because the pipes guided in the centring template are then aligned with the longitudinal passages in the carrier and can then be inserted into the latter.

In a further advantageous configuration of the invention, all the pipes of a pipe holder, which therefore move from one direction into the carrier, are guided by a single centring template. This is also sufficient, since, as soon as the pipes have moved into the longitudinal passage, incorrect attachment is no longer possible and they therefore no longer have to be guided.

So that the centring template, when attaching the pipes to the carrier, always bears against the carrier before the pipes and therefore achieves the centring effect and the guidance effect, it can always be brought into the attachment position either manually or mechanically, even when it does not bear against a carrier. For the sake of simplicity, however, this is automated in such a way that an elastic force or spring force moves the centring template away from the pipe holder into the attachment position thereof. This will be discussed in more detail below.

In yet another advantageous configuration of the invention, provision can be made for the centring template to sit solely on the pipes or for it to be solely guided thereon. This permits a very simple construction.

In an alternative configuration of the invention, at least one longitudinal member can be provided on the pipe holder, wherein the centring template is guided on this longitudinal member and is mounted in a longitudinally displaceable manner thereon. There are advantageously two longitudinal members. A longitudinal member should run outside and to the side of the pipes, in particular it should lead past the carrier when the pipe holder together with pipes is moved up close to the carrier. Here, the centring template can then move, as it were, between or along two longitudinal members, as between two rails or the like, when the pipes move into the longitudinal passages.

In another alternative configuration of the invention, the centring template itself can be fixedly connected to a guide rod, that is to say it can be arranged on the latter in a non-displaceable manner. This guide rod in turn is then movably guided on or in the pipe holder in a longitudinally displaceable manner, to be precise in the longitudinal direction of the pipes. Such a guide rod need not be provided laterally outside the carrier, since of course it is moved in the other direction away from it. Here, in a similar manner to that described above for the longitudinal member, two of such guide rods are advantageously provided for reliable and precise mounting of the centring template. In such a configuration with at least one guide rod, it is also possible for an elastic spring device for moving the centring template to be provided on that side of the pipe holder which faces away from the pipes. It can act there on an end of the guide rod and on the pipe holder itself.

This spring device then attempts to pull the end of the guide rod as close to the pipe holder as possible; it therefore works like a tension spring. Springs described above, in particular in a configuration with longitudinal members, are normally compression springs. Said compression springs then push the centring template away from the pipe holder again towards the carrier or into the attachment position.

In another second basic configuration of the invention, a centring template is likewise provided for encompassing the pipes for inserting the latter into the longitudinal passages of the carrier, wherein the centring template has guides or guide openings for the pipes. It is movable in a relative manner between an attachment position in the end region of the pipes away from the pipe holder and a parking position outside the pipes and at a distance therefrom, in which it does not get in the way of the pipes when the latter are in the carrier. The parking position is preferably above the pipes.

The centring template is advantageously formed and mounted separately from the pipes. However, it can be fastened to an identical carrier frame or the like.

In a configuration of the invention, the centring template can be moved independently of the pipes between the attachment position and the parking position. To this end, it can have a displacing device or the like, advantageously as a linear drive. The movement between the attachment position and the parking position is advantageously a linear movement, in particular in a direction perpendicular to the longitudinal direction of the pipes or an area in which the pipes run.

The centring template together with a displacing device for moving between the parking position and the attachment position is advantageously arranged on a carrier frame which is referred to above and on which the pipe holder with the pipes is arranged. Joint pivoting can thus be facilitated and the relative position is exact.

In a configuration of the invention, the guides of the centring templates are open at the bottom as guide openings for encompassing the pipes. Locking means are provided on the bottom region of the guides, said locking means being designed in such a way that they hold the pipes in the guides. This can be effected in particular by at least partly closing the guides below the encompassed pipes, for which purpose the locking means can advantageously be displaced linearly. In an advantageous configuration, the locking means of all the guides can be connected to one another for the simultaneous movement of all the locking means. This can be controlled in particular by an actuator.

These and further features can be gathered from the description and the drawings, as well as from the claims, and the individual features can be realized on their own, or a plurality thereof can be realized in subcombinations, in an embodiment of the invention and in other fields and can constitute advantageous and independently protectable embodiments, for which protection is claimed here. The subdivision of the application into individual sections and subheadings does not restrict the general validity of the statements made thereunder.

BRIEF DESCRIPTION OF THE DRAWINGS

Exemplary embodiments of the invention are shown schematically in the drawings and are explained in more detail below. In the drawings:

FIG. 1 shows a lateral section through a first device according to the invention, into which a carrier with substrates thereon is moved, wherein pipes engage in longitudinal passages in the carrier, FIG. 2 shows a plan view of the illustration from FIG. 1 in a state just before the pipes are moved into the inner passage of the carrier, FIG. 3 shows an illustration similar to FIG. 2 when the pipes have moved a short distance into the longitudinal passages of the carrier.

DETAILED DESCRIPTION OF THE EXEMPLARY EMBODIMENTS

Figure 4:
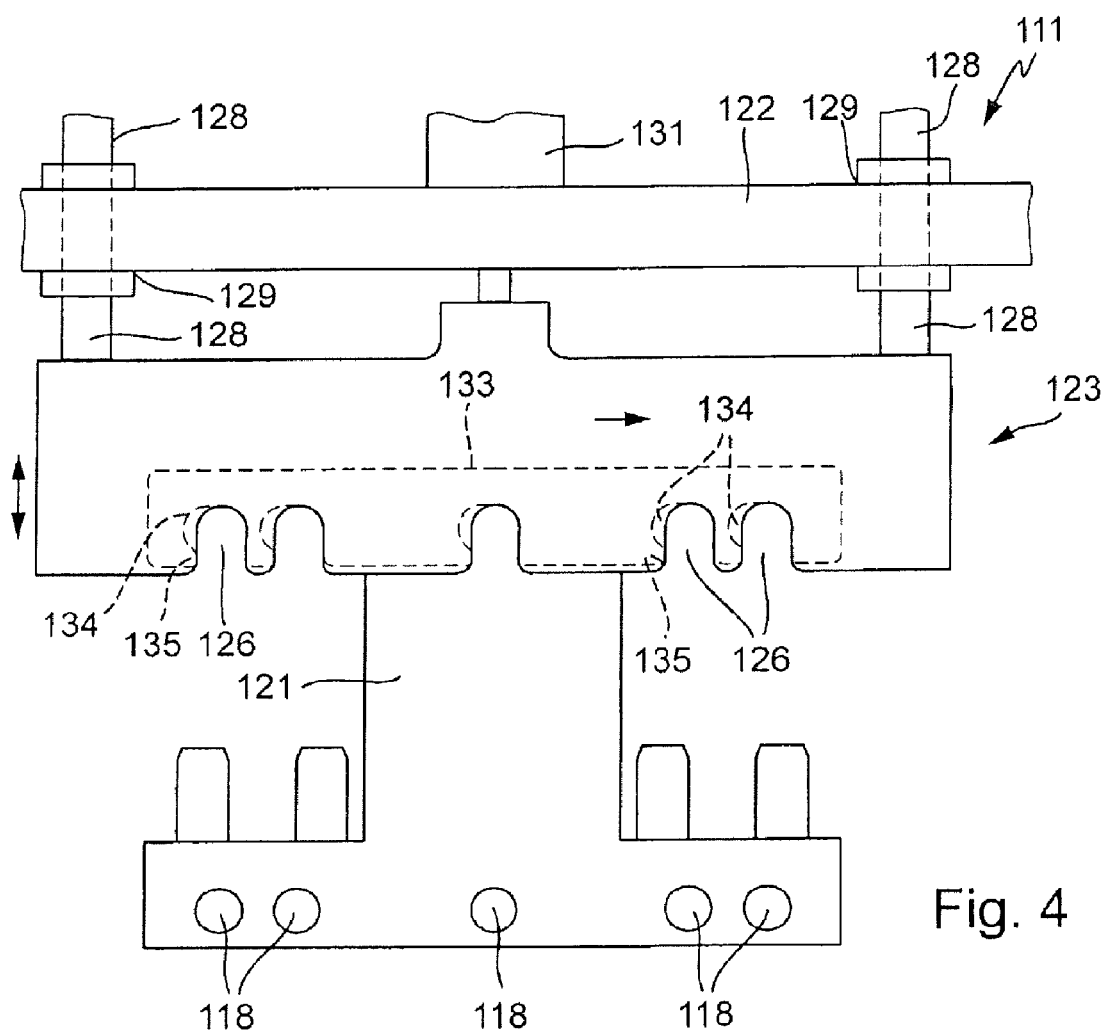
FIG. 4 shows a plan view of a second device according to the invention, having a pipe holder and a centring template above the pipes.

A first embodiment of a device 11 according to the invention is shown in FIG. 1 in a lateral sectional illustration, a carrier 12 being moved into said device 11, a multiplicity of substrates 14 hanging from the underside of said carrier 12. A plurality of longitudinal passages 16 run parallel to one another inside the carrier 12. Due to the sawing of silicon blocks into the substrates 14, saw cuts are made in the carrier 12 the underside and openings are produced which connect the longitudinal passages 16 to spaces between the substrates 14. Such a carrier is known from the German Patent Application DE 10 2009 023 121 A1, reference being made in this respect explicitly to this patent application with regard to construction and configuration of the carrier itself. With regard to the principle of introducing cleaning fluid for cleaning the spaces between the substrates 14, explicit reference is made to the aforementioned DE 10 2009 035 343 A1.

Left-hand pipes 18a are moved into the longitudinal passages 16, and openings 19a are provided at the bottom in the end region of said pipes 18a. The left-hand pipes 18a are fastened to a pipe holder 21a, which is movable in turn in order to introduce precisely these pipes 18a into the longitudinal passages 16.

In the right-hand region of FIG. 1, right-hand pipes 18b having openings 19b close to the end region engage in the longitudinal passages 16. The right-hand pipes 18b are also fastened to the pipe holder 21b and have in addition a fluid connection. Cleaning fluid can therefore be directed into the pipes 18a and 18b via the pipe holders 21a and 21b. Said cleaning fluid then discharges downwards from the openings 19a and 19b between the substrates 14 for the cleaning.

As becomes clear in particular from FIGS. 2 and 3, it is important that all the pipes 18 can be introduced exactly into the longitudinal passages 16 in a relative movement corresponding to the direction of movement B of the carrier 12 in the device 11. So that this is always exactly adapted in a carefully targeted manner in view of the length of the pipes 18 in practice, which can be around 40 cm to 100 cm, and to a small diameter of a few mm, centring templates 23a and 23b are provided according to the invention for both the left-hand pipes 18a and the right-hand pipes 18b. The centring templates 23a and 23b have respective centring projections 25a and 25b, which according to FIG. 2 bear against the carrier 12 before the pipes 18. It can be seen here that the centring template 23a is thus in its attachment position and therefore comes into contact with the carrier 12 before the pipes 18a.

The pipes 18a and 18b run in openings 26a and 26b in the centring template 23a and 23b. By means of the centring projections 25a and 25b, which are designed to be self-centring in conjunction with the carrier 12, the centring templates approach the carrier 12 from both sides in an exactly predetermined position. The accurate guidance of the pipes 18 in the centring templates 23 by means of the openings 26 then in turn easily ensures that the pipes likewise run exactly into the longitudinal passages 16 when the carrier 12 moves relative to the pipe holders 21.

During this relative movement, the centring template 23 in turn remains on the end face of the carrier 12, for which purpose a spring 27 is provided. The latter is schematically depicted here as a compression spring between centring template 23a and pipe holder 21a. The spring 27 ensures that the centring template 23 is moved again to the end of the pipes, that is to say into the attachment position again, when the pipes 18 are removed from the carrier 12 or the longitudinal passages 16 thereof. This is because it is in turn ensured in this attachment position that first of all the centring template 23 comes into contact with the carrier 12 and can be aligned therewith by means of the centring projections 25. As an alternative to the compression spring 27, there could also be a tension spring according to FIG. 2 between one of the left-hand ends of the guides 29 with the pipe holder 21.

On the one hand, it is certainly possible in principle for the pipes 18 themselves to bear the centring template 23 or the weight thereof. In view of the aforesaid length of the pipes 18, this itself would mean an unnecessarily high loading in the case of a light template 23. It is therefore advantageous according to FIGS. 2 and 3 for the centring template 23a to have two guide rods 28a which run in guides 29a in the pipe holder 21a. The centring template 23 certainly requires certain mobility in a plane perpendicular to the direction of movement B in order to be able to adapt itself to or align itself precisely with the approaching carrier 12. In this respect, the guide rods 28 should have certain play in the guides 29 of the pipe holder 21. Play of the pipes 18 in the centring template 23 or the opening 26 thereof should in turn be very slight, since the centring template is of course intended to insert the pipes 18 exactly into the longitudinal passages 16.

In a modification of the centring template 23, it is also easily conceivable that the centring projections 25 do not encompass the carrier 12 laterally on the outside and centre themselves thereon, but rather move into further openings or the like in the carrier 12. Likewise, certain contours can also be provided on the top side of the carrier 12, said contours enabling reliable fixing of the centring template thereon.

The carrier 12 with the substrates 14 runs on a schematically illustrated roller conveyor 17. In practice, of course, the substrates 14 themselves do not run thereon, but rather carrier 12 and substrates 14 are clamped in a cage-like carrier device, which, however, is known from the prior art, and this carrier device then in turn runs on the roller conveyor 17.

Figure 5:
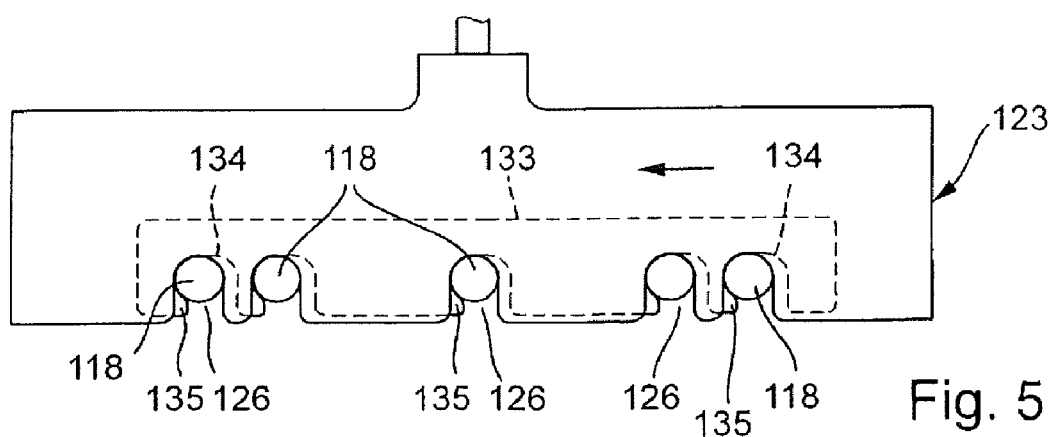
FIG. 5 shows the illustration from FIG. 4 in which the centring template is moved onto the pipes and guides for the pipes are closed.

A second alternative embodiment of a device according to the invention is shown in FIGS. 4 and 5, to be precise in a front view in the longitudinal direction of pipes 118, which project, as it were, from the drawing plane. These pipes 118 are fastened to a pipe holder 121 in a similar manner to FIG. 3. This pipe holder 121, in a manner which is not shown, is in turn pivotable parallel to the pipes 118 about a pivot axis by means of a pivoting arm 122, which continues, for example, to the right. Such a pivoting arm can otherwise also be provided in the embodiments in FIGS. 1 to 3. Thus, the pipes 118 together with pipe holder 121, as described at the beginning, can first of all be moved out of the path of movement of a carrier and then moved in again for moving the carrier onto the pipes 118 or in order to bring the pipes 118 into the carrier.

Also arranged on the pivoting arm 122 is a centring template 123, to be precise via two guide rods 128 which are fastened to the top side thereof. These guide rods 128 run in guides 129 on the pivoting arm 122. The centring template 123 is moved in this direction, as shown on the left by the arrow, upwards and downwards by a linear drive 131, for example in the form of a hydraulic cylinder.

It can be seen that the centring template 123 has guide openings 126 on the underside thereof, said guide openings 126 being U-shaped and exactly matching the pipes 118 in terms of the arrangement. In this case, these guide openings 126 can be slightly wider than the pipes 118, but need not be.

Furthermore, a strip-like locking slide 133 is provided on the centring template 123, which locking slide 133 can be moved back and forth by means of a drive (not shown), to be precise to the right from the position shown in FIG. 4. In the position shown in FIG. 4, it is located in the opening position, which means that the guide openings 126 are completely free at the bottom.

FIG. 5 shows how the centring template 123 has been moved downwards over the pipes 118, such that the latter run into the guide openings 126 or are located therein, to be precise on the top stop of the same as it were. Furthermore, the locking slide 133 has been moved to the right into the locking position, to be precise by a slight distance of about half a pipe diameter. In the process, the locking projections 135, which are also shown in FIG. 4 in broken lines with the outline of the locking slide 133, move in the bottom region of the locking openings 134 by a short distance to the right under the pipes 118. In this case, the locking openings 134 are of U-like design like the guide openings 126, but are wider. This larger width is restricted merely by the locking projections 135 at the bottom left. Thus, when the locking slide 133 is moved to the right, these locking projections 135 can move under the pipes 118 and, as can readily be seen from FIG. 5, prevent said pipes 118 from slipping downwards out of the guide openings 126 or in general from moving no more than desired. The pipes 118 are held, as it were, between the locking projection 135 at the bottom left and the top and right-hand region of the guide openings 126.

Whether this retention concerns fixed clamping for inserting the pipes 118 into the carrier (not shown), or whether said pipes 118 still have slight clearance of motion, for example if the pipes 118 are to be displaceable in the longitudinal direction, can be freely selected and is within the scope of the present invention in this case. It can also be readily conceivable to provide other possibilities instead of the locking slide 133 shown here, for example a strip which is pivoted from below and goes transversely over all the guide openings 126, or the like.

It can also be seen from FIGS. 4 and 5 that the centring template shown here, in the second embodiment of the invention, owing to the fact that it is provided on the same pivoting arm 122 and the latter is also attached to the same carrier frame as the pipe holder 121, always has the same relationship to the pipes 118, except for the vertical position. In the case of the centring template 123 according to FIG. 5 guided over the pipes 118, unlike in FIGS. 1 to 3, the centring template itself is certainly not placed directly against the carrier for the precise alignment. However, it is fixed exactly within the device 111 according to the invention, as are the pipes 118 too. Since the carrier is likewise located within the device 111 in an exactly predetermined position, exact insertion can thus be effected.

It can clearly be seen that, in the second embodiment according to the invention, the centring template 123, after the pipes 118 have been inserted into the carrier, can be removed or releases the pipes 118 and is lifted. This makes the subsequent cleaning process simpler. However, a further actuator or drive 131 is necessary for this purpose.

The invention claimed is:

1. A device for cleaning substrates on a carrier, wherein said carrier has in an interior thereof a plurality of longitudinal passages running parallel to one another and being connected to an outside at an underside of said carrier by means of openings being provided at said underside,
wherein said device has a pipe holder and a plurality of elongated pipes running parallel to one another, being arranged on said pipe holder and being connected in a fluid-conducting manner to a fluid supply, wherein a centring template is provided encompassing said pipes and being movable relative to said pipes in a longitudinal direction thereof,
wherein said centring template has guides for said pipes, a diameter of said guides being only slightly larger than an outside diameter of said pipes,
wherein said centring template is movable in a relative manner between an attachment position in an end region of said pipes away from said pipe holder and a working position lying between said attachment position and said pipe holder.

2. The device according to claim 1, wherein said centring template has protruding centring projections engaging on said carrier, or on an end face pointing towards said centring template, in an exactly predetermined relationship.

3. The device according to claim 2, wherein said centring projections project beyond said ends of said pipes in said attachment position.

4. The device according to claim 1, wherein said centring template accommodates or centers all said pipes of said pipe holder.

5. The device according to claim 1, wherein said centring template is pushed away from said pipe holder into said attachment position by an elastic force or spring force.

6. The device according to claim 1, wherein said centring template is solely guided on said pipes.

7. The device according to claim 1, wherein at least one longitudinal member is provided on said pipe holder and said centring template is guided and is mounted in a longitudinally displaceable manner on said longitudinal member of said pipe holder.

8. The device according to claim 7, wherein said longitudinal member is provided on said pipe holder outside said pipes on both sides.

9. The device according to claim 1, wherein said centring template is fixedly connected to at least one guide rod, wherein said guide rod is movably guided in said pipe holder in a longitudinally displaceable manner in said longitudinal direction of said pipes.

10. The device according to claim 9, wherein an elastic spring device for moving said centring template into said attachment position is provided on that side of said pipe holder which faces away from said pipes and acts on an end, located there, of said guide rod and on said pipe holder itself.

11. An apparatus for cleaning substrates on a carrier,
wherein said carrier has in an interior thereof a plurality of longitudinal passages running parallel to one another and are connected to an outside at an underside of said carrier by means of openings, wherein said apparatus has a plurality of elongated pipes running parallel to one another, being arranged on a pipe holder and being connected in a fluid-conducting manner to a fluid supply,
wherein a centring template is provided for encompassing said pipes for inserting said pipes into said longitudinal passages of said carrier,
wherein said centring template has guides for said pipes and wherein it is movable in a relative manner between an attachment position in an end region of said pipes away from said pipe holder and a parking position outside said pipes and at a distance therefrom.

12. The apparatus according to claim 11, wherein said centring template is formed and mounted separately from said pipes.

13. The apparatus according to claim 11, wherein said centring template is movable independently of said pipes between said attachment position and said parking position.

14. The apparatus according to claim 13, wherein said movement between said attachment position and said parking position is a linear movement.

15. The apparatus according to claim 14, wherein said movement between said attachment position and said parking position runs in a direction perpendicular to said longitudinal direction of said pipes.

16. The apparatus according to claim 11, wherein said parking position is above said pipes.

17. The apparatus according to claim 11, wherein said centring template together with a displacing device for moving between said parking position and said attachment position is arranged on a carrier frame on which said pipe holder with said pipes is arranged.

18. The apparatus according to claim 11, wherein said guides of said centring templates are open at a bottom as guide openings for encompassing said pipes, wherein locking means are provided on said bottom region of said guides, said locking means being designed in such a way that they hold said pipes in said guides by displacement.

19. The apparatus according to claim 18, wherein said locking means are designed for holding said pipes in said guides by at least partly closing said guides below said encompassed pipes.

20. The apparatus according to claim 18, wherein said locking means of all said guides are connected to one another for a simultaneous movement of all said locking means.

* * * * *